(12) United States Patent
Kodama et al.

(10) Patent No.: US 9,724,916 B2
(45) Date of Patent: Aug. 8, 2017

(54) EJECTION VOLUME CORRECTION METHOD FOR INKJET HEAD, EJECTION VOLUME CORRECTION APPARATUS

(71) Applicant: FUJIFILM CORPORATION, Tokyo (JP)

(72) Inventors: Kenichi Kodama, Ashigarakami-gun (JP); Tadashi Omatsu, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 118 days.

(21) Appl. No.: 14/213,939

(22) Filed: Mar. 14, 2014

(65) Prior Publication Data

US 2014/0199472 A1 Jul. 17, 2014

Related U.S. Application Data

(63) Continuation of application No. PCT/JP2012/074127, filed on Sep. 13, 2012.

(30) Foreign Application Priority Data

Sep. 15, 2011 (JP) ................................. 2011-202207

(51) Int. Cl.
*B41J 2/12* (2006.01)
*G01B 15/02* (2006.01)
(Continued)

(52) U.S. Cl.
CPC ................ *B41J 2/12* (2013.01); *B82Y 10/00* (2013.01); *B82Y 40/00* (2013.01); *G01B 15/02* (2013.01); *G03F 7/0002* (2013.01)

(58) Field of Classification Search
CPC . B41J 2/12; G01B 15/02; B82Y 10/00; B82Y 40/00; G03F 7/0002
(Continued)

(56) References Cited

U.S. PATENT DOCUMENTS

2004/0051817 A1 3/2004 Takahashi et al.
2007/0237886 A1* 10/2007 Dijksman .............. B41J 3/4071
427/8
(Continued)

FOREIGN PATENT DOCUMENTS

JP 2004-055520 A 2/2004
JP 2007-326003 A 12/2007
(Continued)

OTHER PUBLICATIONS

Machine Translation of JP 2008100378 A.*
(Continued)

*Primary Examiner* — Dah-Wei D Yuan
*Assistant Examiner* — Jose Hernandez-Diaz
(74) *Attorney, Agent, or Firm* — Studebaker & Brackett PC

(57) ABSTRACT

An aspect of the present invention provides an ejection volume correction method for an inkjet head, including: an arranging step of ejecting functional ink as ink droplets from nozzles of an inkjet head so as to discretely arrange the ink droplets on a front surface of a substrate; a contacting step of filling the functional ink in between a mold and the substrate by causing the mold to contact the ink droplets arranged on the front surface of the substrate; a curing step of curing the filled functional ink so as to generate a functional film; a separating step of separating the mold from the functional film; a measuring step of measuring a thickness of the functional film; and a correcting step of correcting an ejection volume from the nozzles based on the measured thickness.

9 Claims, 12 Drawing Sheets

(51) Int. Cl.
*G03F 7/00* (2006.01)
*B82Y 10/00* (2011.01)
*B82Y 40/00* (2011.01)

(58) Field of Classification Search
USPC .................................................. 427/8, 9, 10
See application file for complete search history.

(56) References Cited

U.S. PATENT DOCUMENTS

| | | | |
|---|---|---|---|
| 2008/0241601 A1* | 10/2008 | Moriwaki | B29C 33/424 428/836 |
| 2009/0267268 A1 | 10/2009 | Yoneda et al. | |
| 2010/0098848 A1* | 4/2010 | Truskett | B82Y 10/00 427/207.1 |
| 2011/0189601 A1* | 8/2011 | Koshiba | G06F 17/50 430/30 |
| 2013/0004669 A1* | 1/2013 | Mataki | B82Y 10/00 427/277 |

FOREIGN PATENT DOCUMENTS

| | | |
|---|---|---|
| JP | 2008-502157 A | 1/2008 |
| JP | 2008100378 A * | 5/2008 |
| JP | 2009-088376 A | 4/2009 |
| JP | 2011-091124 A | 5/2011 |
| JP | 2011-159764 A | 8/2011 |
| JP | 2011-216810 A | 10/2011 |
| WO | 2005/120834 A2 | 12/2005 |
| WO | 2010/047790 A2 | 4/2010 |
| WO | 2010/047790 A3 | 8/2010 |
| WO | 2011/108750 A1 | 9/2011 |

OTHER PUBLICATIONS

An Office Action; "Notification of Reasons for Rejection," issued by the Japanese Patent Office on Oct. 1, 2014, which corresponds to Japanese Patent Application No. 2011-202207 and is related to U.S. Appl. No. 14/213,939; with English language partial translation.
International Search Report; PCT/JP2012/074127; Nov. 13, 2012.
Written Opinion of the International Searching Authority; PCT/JP2012/074127; Nov. 13, 2012.
An Office Action; "Notice of Grounds for Rejection," issued by the Korean Intellectual Property Office on Nov. 12, 2015, which corresponds to Korean Patent Application No. 10-2014-7006954 and is related to U.S. Appl. No. 14/213,939; with English language translation.

* cited by examiner

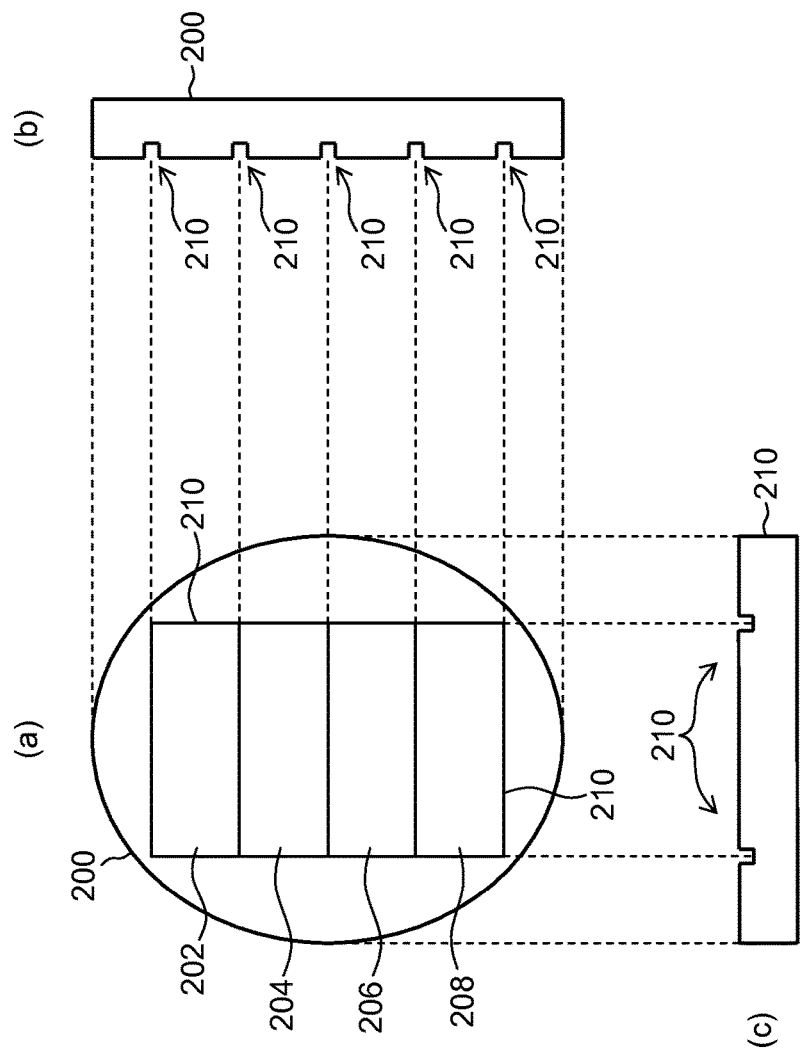

FIG.8
(a)
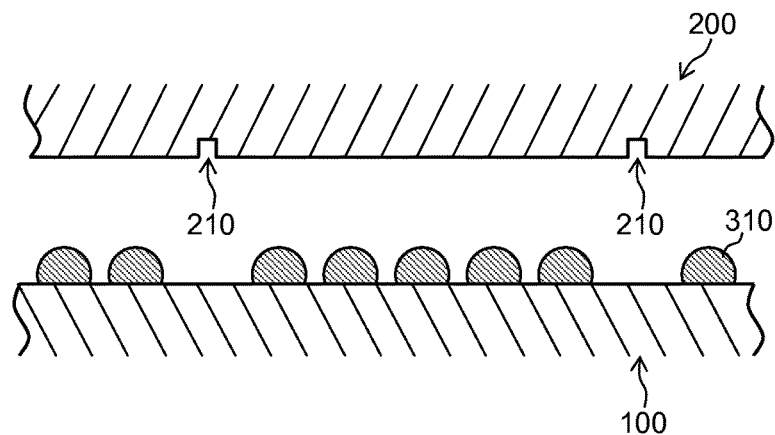
(b)
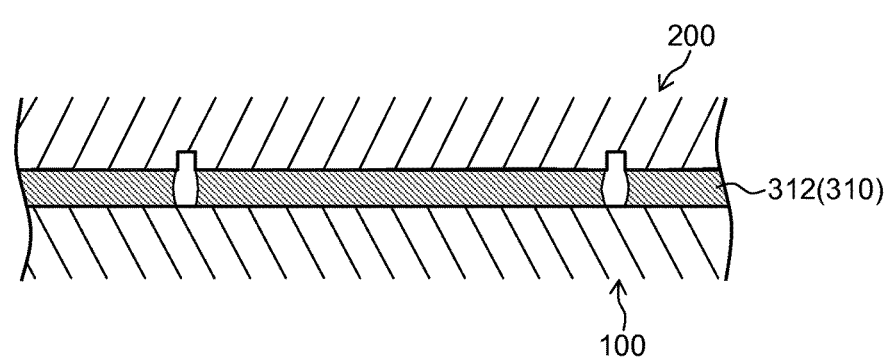
(c)
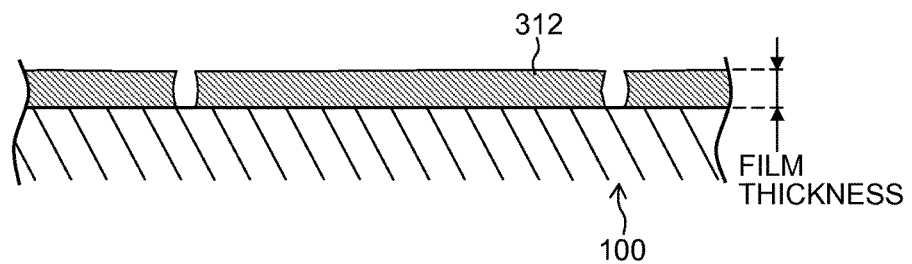

EJECTION VOLUME CORRECTION METHOD FOR INKJET HEAD, EJECTION VOLUME CORRECTION APPARATUS

BACKGROUND OF THE INVENTION

Field of the Invention

The present invention relates to an ejection volume correction method for an inkjet head, an ejection volume correction apparatus, a functional ink arrangement apparatus and a nano-imprinting system, and more particularly, to liquid deposition technology for arranging ink droplets on a medium such as a substrate, by ejecting a functional ink by an inkjet method.

Description of the Related Art

With increased integration of semiconductor integrated circuits in recent years, there have been demands for increased fineness in wiring patterns, and the like. Nanoimprint lithography (NIL) is known as a technique for forming microstructures on substrates. The nanoimprint lithography includes pressing against a resist (UV-curable resin) applied to a substrate a mold having formed thereon the desired protrusion-depression pattern, curing the resist in this state by irradiation with UV radiation, and separating (withdrawing) the mold from the resist located on the substrate, thereby transferring the micropattern formed on the mold to the substrate (resist).

In NIL using an inkjet method, a serious problem is achieving uniform film thickness (residual film thickness) of the pattern which is transferred to the resist.

In response to this problem, Published Japanese Translation of PCT Application No. 2008-502157 discloses technology for achieving uniform film thickness by changing inkjet droplet ejection density and droplet ejection volume in relation to variation in a residual film thickness which occurs due to the roughness of the mold pattern.

Furthermore, Japanese Patent Application Publication No. 2009-88376 discloses technology for achieving uniform film thickness by changing inkjet droplet ejection density and droplet ejection volume in response to variation in a residual film thickness caused by change in an amount of evaporation of resist droplets on a substrate, as a result of differences in the time from the ejection of resist droplets onto the substrate until imprinting.

According to Published Japanese Translation of PCT Application No. 2008-502157 and Japanese Patent Application Publication No. 2009-88376, it is possible to achieve a uniform film thickness in the plane of the substrate.

SUMMARY OF THE INVENTION

As a result of painstaking investigation, the inventors of the present invention have discovered that the ejected droplet volume in an inkjet system is affected by slight differences in the viscosity between different batches of resist. This does not give rise to variations in the residual film thickness in the plane of the substrate, but is problematic because differences occur in the residual film thickness between substrates, when the resist is changed. Furthermore, in cases where the head is replaced due to a breakdown of the inkjet head, or the like, the ejected droplet volume changes and therefore a film thickness differential occurs between the substrates.

However, the film thickness correction technology disclosed in Published Japanese Translation of PCT Application No. 2008-502157 and Japanese Patent Application Publication No. 2009-88376 is aimed at achieving uniform film thickness in the plane of a substrate, but is not capable of achieving uniform film thickness between substrates, when the batch of resist is changed or the head is replaced.

The present invention has been devised in view of these circumstances, an object thereof being to provide an ejection volume correction method for an inkjet head, a correction volume calculation apparatus and a functional ink arrangement apparatus whereby uniform film thickness can be achieved between substrates.

In order to achieve the above object, an embodiment of an ejection volume correction method for an inkjet head includes an arranging step of ejecting functional ink as ink droplets from nozzles of an inkjet head so as to discretely arrange the ink droplets on a front surface of a substrate; a contacting step of filling the functional ink in between a mold and the substrate by causing the mold to contact the ink droplets arranged on the front surface of the substrate; a curing step of curing the filled functional ink so as to generate a functional film; a separating step of separating the mold from the functional film; a measuring step of measuring a thickness of the functional film; and a correcting step of correcting an ejection volume from the nozzles based on the measured thickness.

According to the present embodiment, since the thickness of the cured functional ink is measured and the ejection volume from the nozzles is corrected based on the measured thickness, then it is possible to achieve a uniform film thickness between substrates, even if the viscosity changes between batches of the functional ink (resist material) and even if the inkjet head is replaced.

Desirably, in the arranging step, the ink droplets are arranged by changing the ejection volume from the nozzles in each of prescribed regions on the front surface of the substrate, and in the measuring step, the thickness of the functional film is measured in each of the regions.

Desirably, in the arranging step, the ink droplets are arranged by changing the ejection volume from the nozzles in each of prescribed regions on the front surface of the substrate, and the thickness of the functional film is measured in each of the regions in the measuring step.

Desirably, a surface of the mold in contact with the ink droplets has a plurality of regions formed by a pattern, and in the arranging step, the ink droplets are arranged by changing the ejection volume from the nozzles in respective regions corresponding to the plurality of regions formed by the pattern.

In this way, by forming a plurality of regions on the surface of the mold in contact with the ink droplets, it is possible to measure the thickness of the functional ink in each region, appropriately.

The plurality of regions formed by the pattern may be regions surrounded by grooves formed in the surface of the mold in contact with the ink droplets or regions formed by a lyophilic and repelling pattern formed on the surface of the mold in contact with the ink droplets. In this way, it is possible to appropriately form a plurality of regions on the surface of the mold in contact with the ink droplets.

Desirably, the ejection volume from the nozzles is changed by changing a drive voltage of the nozzles in the arranging step, and the drive voltage of the nozzles is corrected in the correcting step. By changing the driving voltage in this way, it is possible to appropriately change ejection volume from the nozzles.

Desirably, a plurality of nozzles are arranged in the inkjet head at a prescribed interval in a prescribed direction, and in the arranging step, the ink droplets are arranged at shorter interval than the prescribed interval. By arranging the ink droplets in this way, the range in which thickness measurement is carried out is made narrower, and the measurement time can be shortened.

Desirably, in the arranging step, the ink droplets are arranged in such a manner that the interval between the ink droplets is larger than the diameter of the ink droplets. By arranging the ink droplets in this way, it is possible to prevent landing interference.

In the arranging step, ink droplets ejected from all of the nozzles may be arranged in each of the regions on the front surface of the substrate that correspond to the plurality of regions. By arranging ink droplets in this way, it is possible to measure average film thickness including variations between nozzles.

Desirably, in the arranging step, ink droplets ejected from different nozzles are arranged in each of the regions on the front surface of the substrate that correspond to the plurality of regions, and in the correcting step, the ejection volume is corrected for each of the nozzles based on the measured thickness. By arranging ink droplets in this way, it is possible to measure film thickness for each nozzle, so it is possible to adjust ejection volume for each nozzle.

Desirably, a plurality of nozzles are arranged in the inkjet head at a prescribed interval in a prescribed direction, and the ink droplets are arranged at a shorter interval than the prescribed interval in the arranging step.

Desirably, in the arranging step, the ink droplets are arranged in such a manner that an interval between the ink droplets is greater than a diameter of the ink droplets.

Desirably, the method further includes a velocity measuring step of measuring an ejection velocity of the ink droplets ejected from the nozzles; and a storing step of storing a relationship between the measured ejection velocity and the measured thickness in a memory, wherein, in the correcting step, the ejection volume from the nozzles is corrected based on the measured ejection velocity. By storing the relationship between the measured ejection velocity and the measured thickness in advance, ejection volume from the nozzles can be corrected only by measuring the ejection velocity. Consequently, it is possible to promptly correct ejection volume without measuring film thickness.

Desirably, the thickness of the functional film is measured with an atomic force microscope in the measuring step. In this way, it is possible to conduct measurement in high accuracy.

Desirably, the thickness of the functional film is measure with an ellipsometer in the measuring step. In this way, it is possible to conduct measurement relatively easily and accurately.

To achieve the above object, an embodiment of a nano-imprinting system includes: an inkjet head which ejects functional ink as ink droplets from nozzles towards a substrate; a scanning device which causes relative movement of the substrate and the inkjet head; an arrangement device which discretely arranges the ink droplets on the substrate by ejecting the ink droplets from the nozzles of the inkjet head under prescribed conditions while relatively moving the substrate and the inkjet head by the scanning device; a contacting device which fills the functional ink in between a mold and the substrate by causing the mold to contact the ink droplets arranged on a front surface of the substrate; a curing device which cures the filled functional ink so as to generate a functional film; a separating device which separates the mold from the functional film; a measuring device which measures a thickness of the functional film; and a correcting device which corrects an ejection volume from the nozzles based on the measured thickness.

According to the present embodiment, since a functional film is generated and the ejection volume from the nozzles is corrected based on the thickness of the generated functional film, then it is possible to achieve a uniform film thickness between substrates.

To achieve the above object, an embodiment of a functional ink arrangement apparatus includes: an inkjet head which ejects functional ink as ink droplets from nozzles towards a substrate; a scanning device which causes relative movement of the substrate and the inkjet head; an arrangement device which discretely arranges the ink droplets on the substrate by ejecting the ink droplets from the nozzles of the inkjet head under prescribed conditions while relatively moving the substrate and the inkjet head by the scanning device, and which arranges the ink droplets by changing an ejection volume from the nozzles in each of prescribed regions on a front surface of the substrate; and a correction device which corrects the ejection volume from the nozzles by correcting the prescribed conditions based on a relationship table stored in a storage device.

According to the present embodiment, since the ink droplets are arranged by changing the ejection volume from the nozzles in each of prescribed regions on the front surface of the substrate, then the relationship table can be calculated easily. Furthermore, since the ejection volume from the nozzles is corrected based on the relationship table stored in the storage device, then it is possible to achieve uniform film thickness between the substrates.

To achieve the above object, an embodiment of an ejection volume correction apparatus for an inkjet head includes: an acquisition device which acquires a thickness of a functional film generated in a prescribed nano-imprinting system; a calculation device which calculates a relationship table between the acquired thickness and prescribed conditions under which ink droplets are ejected from nozzles of an inkjet head in the prescribed nano-imprinting system; and a storage device which stores the calculated relationship table, wherein the prescribed nano-imprinting system includes: the inkjet head which ejects functional ink as the ink droplets from the nozzles towards a substrate; a scanning device which causes relative movement of the substrate and the inkjet head; an arrangement device which discretely arranges the ink droplets on the substrate by ejecting the ink droplets from the nozzles of the inkjet head under the prescribed conditions while relatively moving the substrate and the inkjet head by the scanning device, and which arranges the ink droplets by changing an ejection volume from the nozzles in each of prescribed regions on a front surface of the substrate; a contacting device which fills the functional ink in between a mold and the substrate by causing the mold to contact the ink droplets arranged on the front surface of the substrate; a curing device which cures the filled functional ink so as to generate the functional film; and a separating device which separates the mold from the functional film.

According to the present embodiment, since the thickness of the functional film is acquired and a relationship table of the acquired thickness and the prescribed conditions is calculated and the calculated relationship table is stored, then it is possible to correct the ejection volume of an inkjet head appropriately, by using this relationship table. Consequently, it is possible to achieve uniform film thickness between substrates.

According to the present invention, it is possible to achieve uniform film thickness between substrates, even if the viscosity changes with the batch of functional ink, or if the inkjet head is replaced.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 4 is a diagram showing a mold for film thickness measurement;

FIG. 8 is a cross-sectional diagram of a substrate, a mold and ink droplets arranged on the substrate;

DETAILED DESCRIPTION OF THE EMBODIMENTS

[Explanation of Nanoimprint Method]

First, the nanoimprint method according to a present embodiment will be explained with reference to FIG. 1 by tracing the process sequence thereof. With the nanoimprint method shown in the present example, a protrusion-depression pattern formed on a mold (for example, a Si mold) is transferred to a photocurable resin film obtained by curing a functional ink (photocurable resin liquid) formed on a substrate (quartz substrate or the like), and a micropattern is formed on the substrate by using the photocurable resin film as a master pattern.

Figure 1:
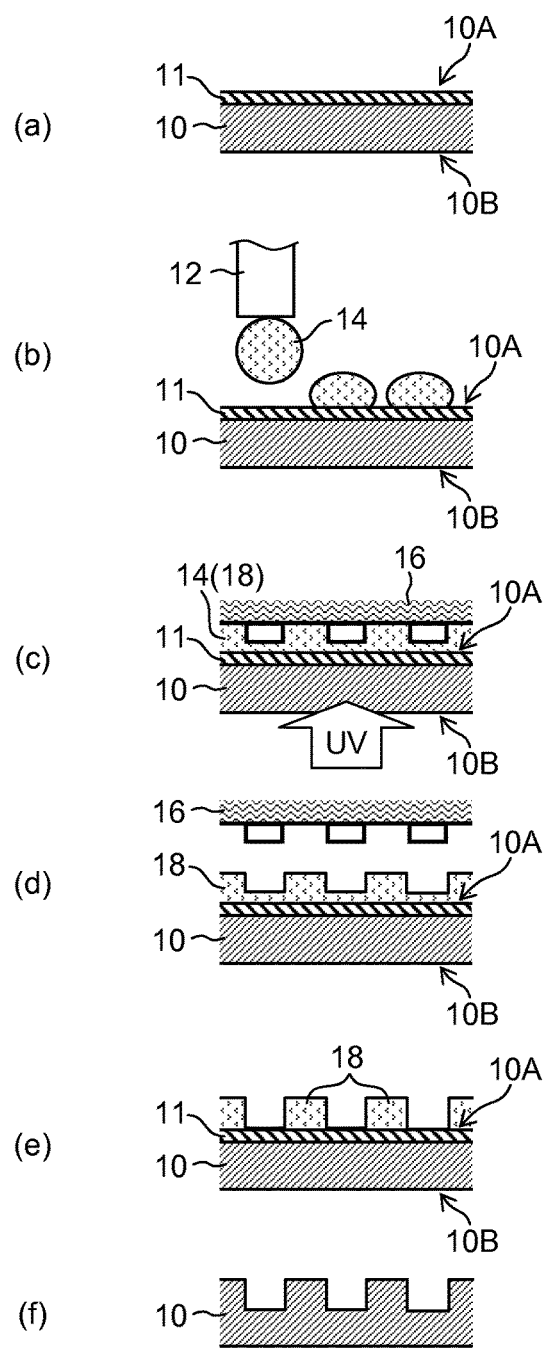
FIG. 1 is a step diagram showing a nano-imprinting method.

First, a quartz substrate 10 (referred to hereinbelow simply as "substrate") shown in (a) of FIG. 1 is prepared. A hard mask layer 11 is formed on a front surface 10A of the substrate 10 shown in (a) of FIG. 1, and a micropattern is formed on the front surface 10A. The substrate 10 has a predetermined transmissivity allowing the substrate to transmit light such as UV radiation and may have a thickness of equal to or greater than 0.3 mm. Such light transmissivity makes it possible to conduct exposure from a rear surface 10B of the substrate 10.

Examples of substrates suitable as the substrate 10 used when a Si mold is used include substrates covered on the surface thereof with a silane coupling agent, substrates laminated with a metal layer constituted by Cr, W, Ti, Ni, Ag, Pt, Au, and the like, substrates laminated with a metal oxide layer such as $CrO_2$, $WO_2$, and $TiO_2$, and such laminates covered on the surface thereof with a silane coupling agent.

Thus, a laminate (covered material) such as the aforementioned metal film or metal oxide film is used as the hard mask layer 11 shown in (a) of FIG. 1. Where the thickness of the laminate exceeds 30 nm, light transmissivity decreases and curing defects easily occur in the photocurable resin. Therefore, the laminate thickness is equal to or less than 30 nm, preferably equal to or less than 20 nm.

The "predetermined transmissivity" as referred to herein ensures that the light coming from the rear surface 10B of the substrate 10 will exit from the front surface 10A and that the functional ink (for example, the liquid including the photocurable resin that is denoted by the reference numeral 14 in (c) of FIG. 1) formed on the front surface 10A will be sufficiently cured. For example, the transmittance of light with a wavelength of equal to or greater than 200 nm that comes from the rear surface 10B may be equal to or greater than 5%.

The structure of the substrate 10 may be a monolayer structure or a laminated structure. In addition to quartz, such materials as silicon, nickel, aluminum, glass, and resins can be used as appropriate for the substrate 10. These materials may be used individually or may be used as appropriate in combinations of two or more thereof.

The thickness of substrate 10 is preferably equal to or greater than 0.05 mm, more preferably equal to or greater than 0.1 mm. Where the thickness of the substrate 10 is less than 0.05 mm, it is possible that a deflection will occur on the substrate side and a uniform contact state will not be obtained when the mold and the body where the pattern is to be formed are brought into intimate contact. Further, with the object of avoiding fractures during handling or under pressure during imprinting, it is even more preferred that the thickness of the substrate 10 be equal to or greater than 0.3 mm.

A plurality of droplets 14 inducing a photocurable resin are discretely jetted out of an inkjet head 12 onto the front surface 10A of the substrate 10 ((b) of FIG. 1: jetting step). The expression "droplets discretely jetted out" herein means that a plurality of droplets have landed with a predetermined spacing, without coming into contact (causing landing interference) with other droplets that have landed at the adjacent jetting positions on the substrate 10.

The droplet ejection amount of droplets 14, ejected droplet density, and discharge (flying) speed of droplets are set (adjusted) in advance in the jetting step illustrated by (b) of FIG. 1. For example, the droplet amount and ejected droplet density are adjusted so as to be relatively large in a region with a large spatial volume of depressions of the protrusion-depression pattern of the mold (denoted by the reference numeral 16 in (c) of FIG. 1) and relatively small in a region with a small spatial volume of depressions or regions without the depressions. After the adjustment, the droplets 14 are arranged on the substrate 10 according to the predetermined landing arrangement (pattern).

After the jetting step illustrated by (b) of FIG. 1, the protrusion-depression pattern surface of the mold 16 where the protrusion-depression pattern has been formed is pressed against the front surface 10A of the substrate 10 by a predetermined pressing force, droplets 14 present on the substrate 10 are expanded, and a photocurable resin film 18 constituted by the plurality of expanded droplets 14 joined together is formed ((c) of FIG. 1: photocurable resin film formation step).

In the photocurable resin film formation step, after the atmosphere between the mold 16 and the substrate 10 has been depressurized or evacuated, the amount of residual gas can be reduced by pressing the mold 16 against the substrate 10. However, under high-vacuum atmosphere, the uncured photocurable resin film 18 volatilizes and a uniform film thickness can be difficult to maintain. Accordingly, the amount of residual gas may be reduced by substituting the atmosphere between the mold 16 and the substrate 10 with helium (He) atmosphere or He reduced-pressure the atmosphere. Since He permeates the quartz substrate 10, the amount of the residual gas (He) that has been taken in is gradually reduced. Since a certain time is required for the He permeation, the He reduced-pressure the atmosphere is preferred.

The pressing force of the mold 16 is within a range of from 100 kPa to 10 MPa. A relatively high pressing force enhances the resin flow, also enhances the compression of the residual gas and dissolution of the residual gas in the photocurable resin and the He permeation in the substrate 10, and leads to the improved tact time. However, where the pressing force is too high, it is possible that foreign matter will be pressed into and the mold 16 and the substrate 10 will be damaged when the mold 16 comes into contact with the substrate 10. For this reason, the pressing force of the mold 16 is set within the abovementioned range.

The range of the pressing force of the mold 16 is more preferably from 100 kPa to 5 MPa, even more preferably from 100 kPa to 1 MPa. The pressing force is set to a value equal to or higher than 100 kPa so that the space between the mold 16 and the substrate 10 be filled with droplets 14 and the space between the mold 16 and the substrate 10 be pressurized under the atmospheric pressure (about 101 kPa) when imprinting is performed under the atmosphere.

Irradiation with UV radiation is then performed from the rear surface 10B of the substrate 10, the photocurable resin film 18 is exposed, and the photocurable resin film 18 is cured ((c) of FIG. 1: the photocurable resin film curing step). In the present example, a photocurable system is illustrated in which the photocurable resin film 18 is cured by light (UV radiation), but another curing system may be also used. For example, a thermocurable resin film may be formed by using a liquid including a thermocurable resin and the thermocurable resin film may be cured by heating.

After the photocurable resin film 18 has been sufficiently cured, the mold 16 is separated from the photocurable resin film 18 ((d) of FIG. 1: separation step). Any method that is unlikely to damage the pattern of the photocurable resin film 18 may be used for separating the mold 16. Thus, the mold may be separated gradually from the edge portion of the substrate 10, or the separation may be performed, while applying a pressure from a side of the mold 16, so as to reduce the force applied to the photocurable resin film 18 on a boundary line at which the mold 16 is separated from the photocurable resin film 18 (pressurization separation method). Further, a method (heating-assisted separation) can be also used in which the vicinity of the photocurable resin film 18 is heated, an adhesive force between the photocurable resin film 18 and the mold 16 at the interface of the mold 16 and the photocurable resin film 18 is reduced, the Young's modulus of the photocurable resin film 18 is reduced, resistance to embrittlement is improved, and fracture caused by deformation is inhibited. A composite method in which the abovementioned methods are combined as appropriate may be also used.

In the steps shown in (a) to (d) of FIG. 1, the protrusion-depression pattern formed on the mold 16 is transferred to the photocurable resin film 18 formed on the front surface 10A of the substrate 10. In the photocurable resin film 18 formed on the substrate 10, the ejected droplet density of droplets 14 that will form the photocurable resin film 18 is optimized according to physical properties of the liquid including the photocurable resin and the protrusion-depression state of the mold 16. Therefore, the uniformity of residual thickness is improved, and the desirable protrusion-depression pattern that is free of defects is formed. A fine pattern is then formed on the substrate 10 (or metal film covering the substrate 10) by using the photocurable resin film 18 as a mask.

Where the protrusion-depression pattern of the photocurable resin film 18 located on the substrate 10 is transferred, the photocurable resin located inside the depressions of the photocurable resin film 18 is removed, and the front surface 10A of the substrate 10 or the metal film formed on the front surface 10A is exposed ((e) of FIG. 1: ashing step).

Where dry etching is thereafter performed by using the photocurable resin film 18 as a mask ((f) of FIG. 1: etching step) and the photocurable resin film 18 is removed, a fine pattern 10C corresponding to the protrusion-depression pattern formed on the photocurable resin film 18 is formed on the substrate 10. Where a metal film or a metal oxide film is formed on the front surface 10A of the substrate 10, the predetermined pattern is formed on the metal film or metal oxide film.

Any method may be used for dry etching, provided that this method can use the photocurable resin film as a mask. Specific examples of suitable methods include ion milling method, reactive ion etching (RIE), and sputter etching. Among these methods, ion milling method and reactive ion etching (RIE) are especially preferred.

The ion milling method is also called ion beam etching. In this method, ions are generated by introducing an inactive gas such as Ar into an ion source. The generated ions are accelerated when passing through a grid and collided with the sample substrate, thereby etching the substrate. An ion source of a Kaufman type, a high-frequency type, an electron collision type, a duoplasmatron type, a Freeman type, and an ECR (electron cyclotron resonance) type can be used. Ar gas can be used as the process gas in ion beam etching, and fluorine-containing gas or chlorine-containing gas can be used as the etchant of RIE.

As described hereinabove, the fine pattern using the nanoimprint method shown in the present example is formed by using as a mask the photocurable resin film 18 onto which the protrusion-depression pattern of the mold 16 has been transferred, and performing dry etching by using the mask that is free from defects caused by thickness unevenness of the remaining film and residual gasses. Therefore, the fine patter can be formed on the substrate 10 with high accuracy and good yield.

By using the above-described nanoimprint method, it is possible to fabricate a quartz substrate mold for use in the nanoimprint method.

Method of Correcting Ejection Volume: First Embodiment

As described above, a concavoconvex pattern formed in a mold 16 is transferred to the photocurable resin film 18. In the subsequent ashing step, it is necessary for the thickness of the photocurable resin film 18 to be uniform, in order that the ashing conditions are kept uniform between substrates at all times. In other words, it is necessary for the droplets 14 ejected from the inkjet head to have a uniform volume.

However, the volume of the droplets 14 ejected from the inkjet head changes with variation in the viscosity of the resin material between different batches of resin. Consequently, this gives rise to variation in the thickness of the photocurable resin film 18 between substrates. Furthermore, a similar problem also occurs when the inkjet head is replaced. In order to resolve this problem, the ejection volume of the inkjet head should be corrected so as to remain uniform, each time the batch of resist material changes, or each time the inkjet head is replaced.

Figure 2:
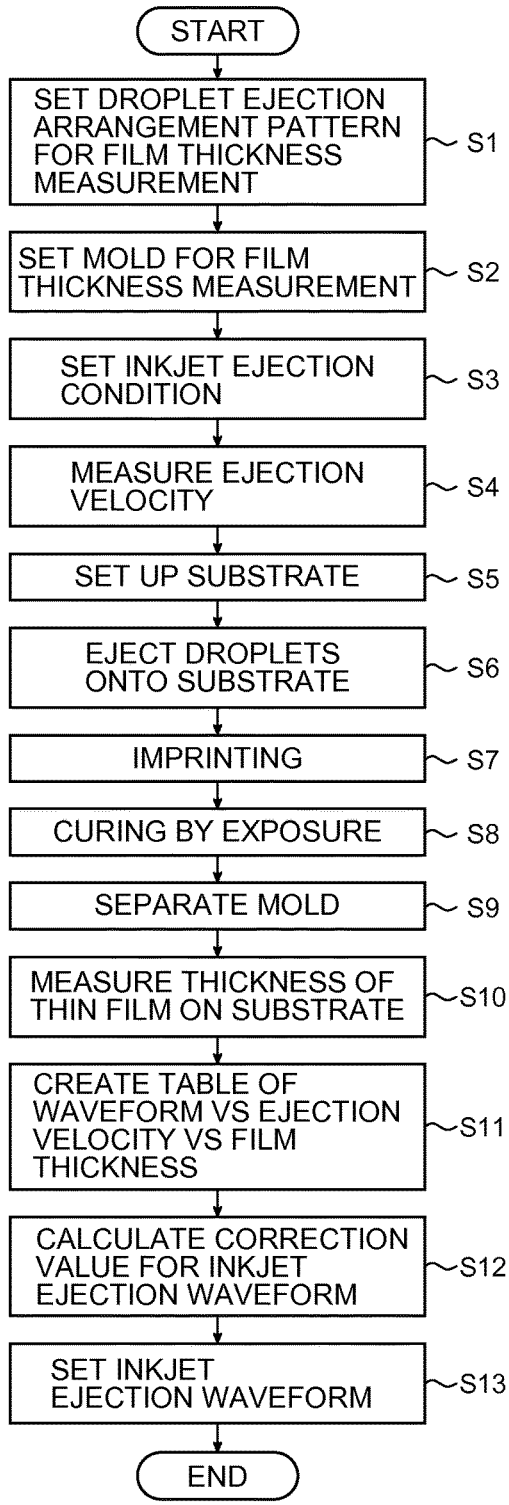
FIG. 2 is a flowchart showing a method of correcting an inkjet ejection volume relating to a first embodiment.

FIG. 2 is a flowchart showing a method of correcting an inkjet ejection volume relating to the present embodiment. Here, a film for film thickness measurement is actually generated and the thickness of the generated film is measured and the ejection volume is corrected in accordance with the measured thickness.

Firstly, a droplet ejection arrangement pattern for film thickness measurement is printed (step S1).

Figure 3A:
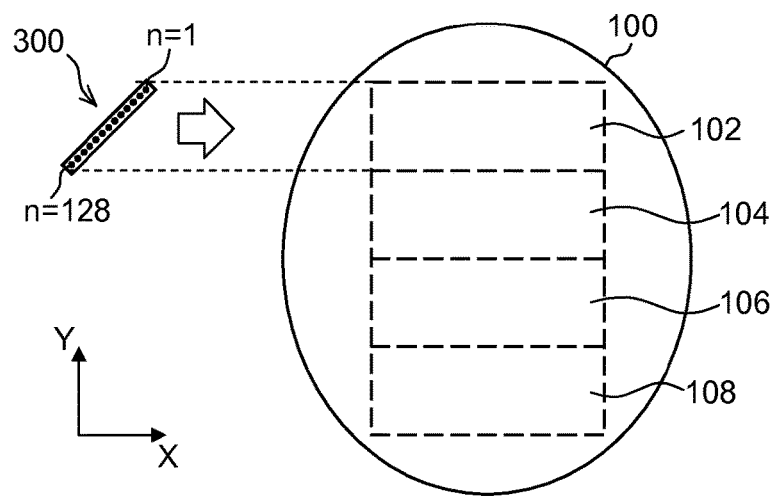
FIG. 3A is a schematic drawing showing a substrate for film thickness measurement and an inkjet head.

FIG. 3A is a schematic drawing of a substrate for film thickness measurement (substrate) 100, and an inkjet head 300 which discretely arranges functional ink droplets on a front surface of the substrate 100 by ejecting droplets of functional ink while moving by means of a scanning device (not illustrated).

The substrate 100 is a thin plate-shaped base material having a prescribed transmissivity, for which quartz is used, for example. Four regions 102, 104, 106 and 108 are set on the front surface of the substrate 100 so as to correspond to the regions of a mold, which is described hereinafter.

The inkjet head 300 is composed so as to be capable of performing a scanning action in X and Y directions over the front surface of the substrate 100 by means of a scanning device (not illustrated). 128 nozzles which eject functional ink are arranged in one direction (in one row) in the lower surface of the inkjet head 300. There are no particular restrictions on the number and arrangement of the nozzles, and it is possible to include a greater number of nozzles, and to arrange the nozzles in a staggered configuration or a matrix configuration.

The regions 102 to 108 each have a width (Y-direction length) which covers all of the nozzles of the inkjet head 300. In other words, when ink is ejected while the inkjet head 300 performs a scanning action in the X direction, the ink ejected from all of the nozzles can be ejected so as to be arranged within one region.

Figure 3B:
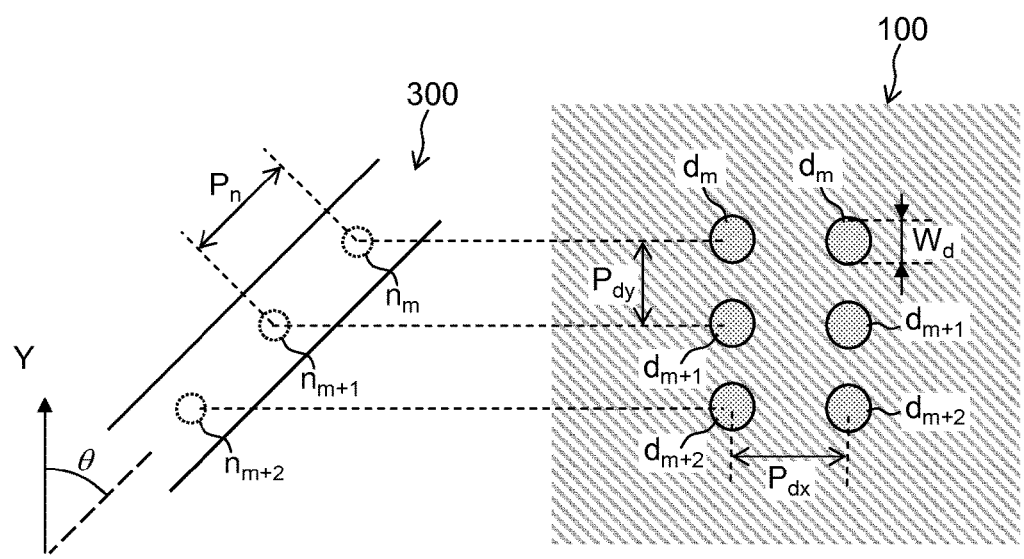
FIG. 3B is a schematic drawing showing nozzles of an inkjet head and ink droplets which are ejected from the nozzles and arranged on a substrate.

FIG. 3B is a schematic drawing showing nozzles $n_m$, $n_{m+1}$ and $n_{m+2}$ of the inkjet head 300 and ink droplets $d_m$, $d_{m+1}$ and $d_{m+2}$ arranged on the substrate 100 by being ejected from the nozzles.

As shown in FIG. 3B, the respective nozzles of the inkjet head 300 are arranged at a nozzle pitch (nozzle interval) of Pn. Furthermore, the inkjet head 300 is arranged in such a manner that the nozzle arrangement direction is inclined through an angle of θ from the Y direction.

Furthermore, in FIG. 3B, the ink droplet $d_m$ is an ink droplet ejected from nozzle $n_m$, the ink droplet $d_{m-1}$ is an ink droplet ejected from nozzle $n_{m+1}$ and the ink droplet $d_{m+2}$ is an ink droplet ejected from nozzle $n_{m+2}$. The nozzle pitch $P_n$ and the droplet ejection pitch between the ink droplets in the Y direction (droplet ejection interval) $P_{dy}$ has the relationship $P_{dy} = P_n \times \cos\theta$. Here, since $\theta \neq 0$, then $P_n > P_{dy}$. In this way, by making the droplet ejection pitch smaller than the nozzle pitch, it is possible to make the region where droplets are ejected narrower. Consequently, the range of film thickness measurement, which is described below, can be made narrower.

The droplet ejection pitch of the ink droplets in the X direction and the Y direction is greater than the diameter $W_d$ of the ink droplets. In other words, if the droplet ejection pitch in the X direction is $P_{dx}$, then there are the relationships $P_{dx} > W_d$ and $P_{dy} > W_d$. By ejecting droplets discretely in this way, it is possible to prevent landing interference.

The arrangement pattern of the ink droplets is set as described above. Here, the number of ink droplets per unit surface area in the set arrangement pattern (the droplet ejection density) is called D.

Next, a mold for film thickness measurement is set up (step S2). In the present embodiment, the mold for film thickness measurement (mold) 200 shown in FIG. 4 is used. The mold 200 is a thin plate-shaped base material having a structure of substantially the same size as the substrate 100.

(a) of FIG. 4 is a diagram showing a contacting surface of the mold 200, (b) of FIG. 4 is a diagram showing a cross-section of the mold 200 in the Y direction, and (c) of FIG. 4 is a diagram showing a cross-section of the mold 200 in the X direction. Grooves 210 are formed in a contacting surface of the mold 200, and regions 202, 204, 206 and 208 surrounded by the grooves 210 are formed.

The regions 102, 104, 106 and 108 of the substrate 100 described above are set so as to correspond to the regions 202, 204, 206 and 208 of the mold 200. In other words, the regions 102, 104, 106 and 108 of the substrate 100 and the regions 202, 204, 206 and 208 of the mold 200 are set so as to be respectively superimposed when the contacting surface of the mold 200 is set to oppose the front surface of the substrate 100.

Figure 5:
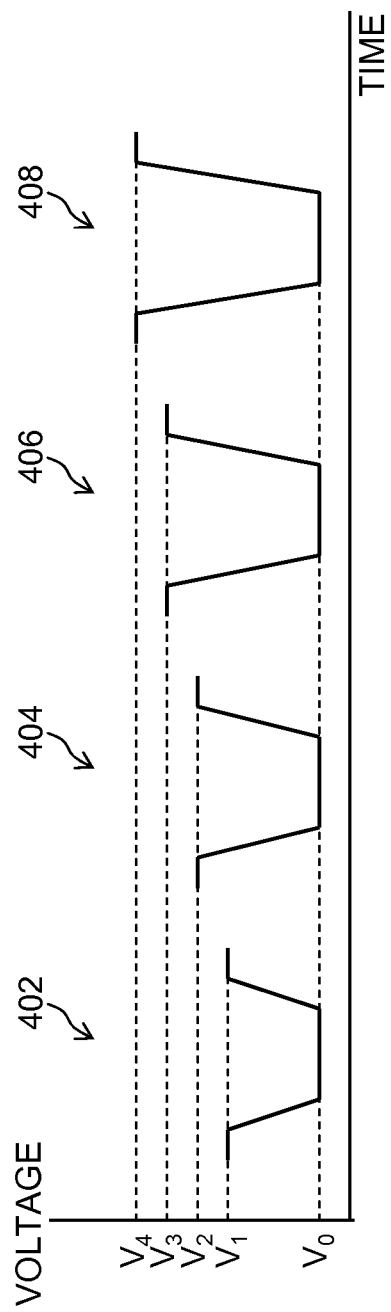
FIG. 5 is a diagram showing a plurality of ejection waveforms having respectively different drive voltages.

Next, the inkjet ejection conditions are set in such a manner that the ejection volume is different in each region (step S3). The nozzles of the inkjet head are composed in such a manner that the drive voltage thereof can be changed. Here, as shown in FIG. 5, the inkjet head is composed in such a manner that one ejection waveform of an ejection waveform 402 having a drive voltage V1, an ejection waveform 404 having a drive voltage V2, an ejection waveform 406 having a drive voltage V3 and an ejection waveform 408 which is a square wave having a drive voltage V4, can be selected for each nozzle.

Figure 6:
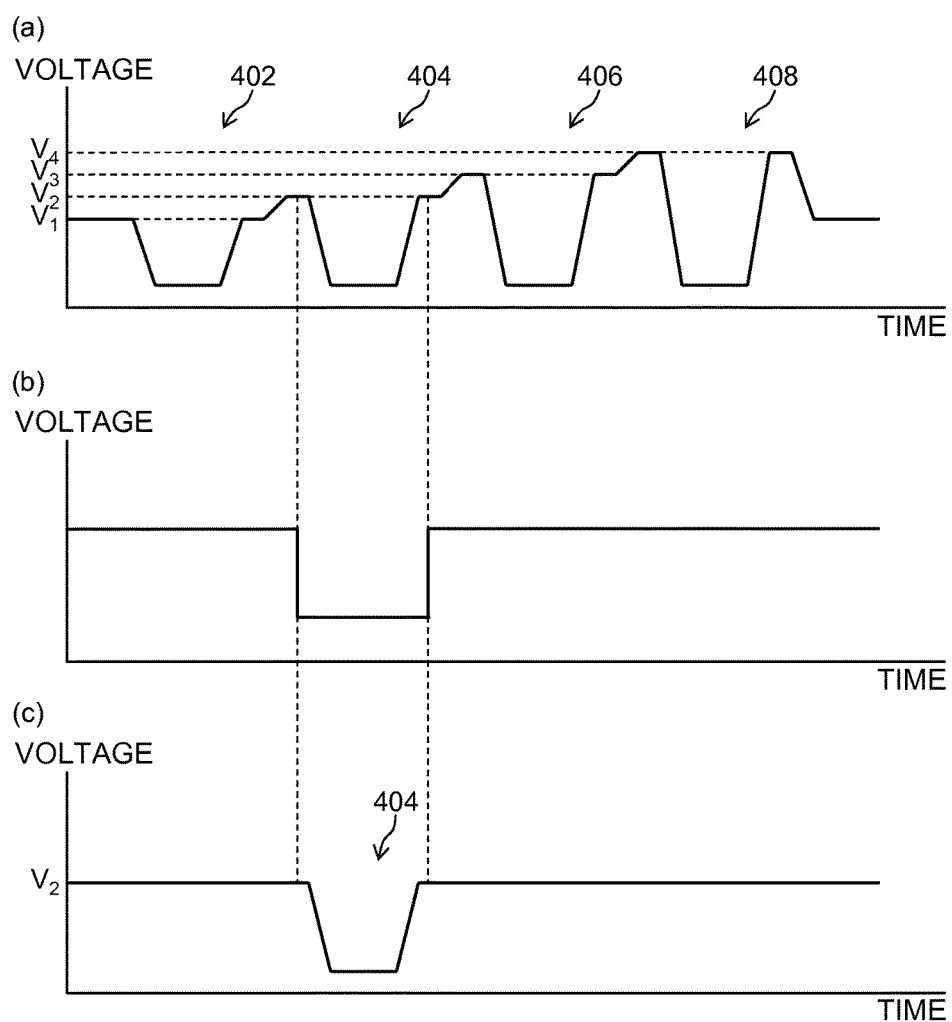
FIG. 6 is a diagram showing waveforms having four ejection waveforms as respective waveform elements.

For instance, as shown in (a) of FIG. 6, it is possible to adopt a composition in which the waveform of one ejection cycle is one continuous waveform in which four ejection waveforms 402, 404, 406 and 408 are used as respective waveform elements, and one ejection waveform is output by selecting any one ejection waveform element using an enable signal. (b) of FIG. 6 shows one example of an enable signal. Furthermore, (c) of FIG. 6 shows an ejection waveform which is output by the enable signal shown in (b) of FIG. 6, and the ejection waveform 404 having a drive voltage V2 is output.

By adopting a composition of this kind, it is possible to select and output any one ejection waveform of the four ejection waveforms 402, 404, 406 and 408 for each nozzle.

Furthermore, it is also possible to adopt a composition in which the digital waveform data which is the basis of the ejection waveform is set in such a manner that a waveform based on the set data is output for each nozzle.

Figure 7:
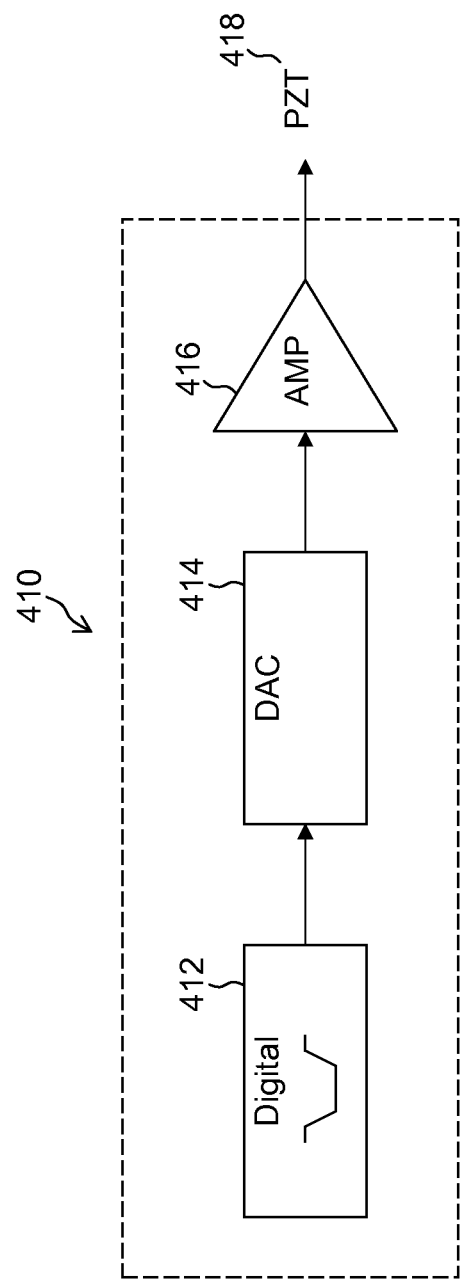
FIG. 7 is a block diagram showing an ejection waveform output unit.

FIG. 7 is a block diagram showing an ejection waveform output unit 410 which is employed in this case. The ejection waveform output unit 410 comprises a digital waveform generating unit 412, a D/A converter 414 and an amplifier 416.

Firstly, a desired digital waveform data is set in the digital waveform generating unit 412. The digital waveform generating unit 412 outputs the set digital waveform at the functional ink ejection timing. The output digital waveform is converted to an analog waveform by the D/A converter 414, and is supplied to the nozzles (here, the piezo elements 418) after the current has been amplified by the amplifier 416.

By adopting a composition of this kind, it is possible to achieve compatibility readily, even if there are many types of waveforms.

Here, the ejection waveform of the nozzles of the inkjet head 300 is set to the ejection waveform 402 when ejecting droplets onto the region 102, to the ejection waveform 404 when ejecting droplets onto the region 104, to the ejection waveform 406 when ejecting droplets onto the region 106 and to the ejection waveform 408 when ejecting droplets onto the region 108. In other words, droplet ejection is performed onto the region 102 at the drive voltage V1, onto the region 104 at the drive voltage V2, onto the region 106 at the drive voltage V3 and onto the region 108 at the drive voltage V4.

Next, ink droplets are ejected from the nozzles using functional ink of the batch actually being used, and the velocity of the ejection droplets (ejection speed) is measured (step S4). In this case, the ejection velocities in the case of the ejection waveforms 402, 404, 406 and 408 are respectively measured for each nozzle. The ejection velocities are measured by emitting a strobe when a prescribed time period has elapsed after ejection in synchronism with the ejection waveform, for example, and observing the projected positions of the ejected droplets. The method of measuring the ejection velocities is not limited to this, and other commonly known methods can be used, for instance, measuring based on the timing of intersection between respective laser light beams arranged at prescribed intervals apart.

Next, the substrate 100 shown in FIGS. 3A and 3B is set in a prescribed position (step S5), and droplets of functional ink are ejected onto the respective regions 102 to 108 on the front surface side of the substrate 100 from the inkjet head 300 (step S6: arranging step).

The inkjet head 300 firstly ejects droplets of ink with the ejection waveform 402 so as to achieve the arrangement pattern specified in step S1, onto the region 102 of the substrate 100, while performing a scanning action in the X direction. In this case, the inkjet head 300 performs a scanning action in such a manner that the ink droplets ejected from all of the nozzles of the inkjet head 300 are arranged inside the region 102.

After ejecting droplets of ink onto the region 102, the inkjet head 300 performs a scanning action in the Y direction until reaching a position where the ink droplets ejected from all of the nozzles can be arranged inside the region 104. Thereupon, the inkjet head 300 ejects droplets of ink with the ejection waveform 404 so as to achieve the arrangement pattern specified in step S1, onto the region 104, while again performing a scanning action in the X direction.

After ejecting droplets of ink onto the region 104, the inkjet head 300 performs a further scanning action in the Y direction until reaching a position where the ink droplets ejected from all of the nozzles can be arranged inside the region 106. Thereupon, the inkjet head 300 ejects droplets of ink with the ejection waveform 406 so as to achieve the arrangement pattern specified in step S1, onto the region 106, while performing a scanning action in the X direction.

After ejecting ink droplets onto the region 106, the inkjet head 300 ejects ink droplets with the ejection waveform 408 onto the region 108, in a similar fashion, so as to achieve the arrangement pattern specified in step S1.

When ejection of ink droplets has been completed over the whole region, a surface (contacting surface) of the mold 200 shown in (a) to (c) of FIG. 4 in which grooves 210 are formed is made to contact the droplets of functional ink which have been arranged on the front surface of the substrate 100 (step S7: contacting step).

(a) of FIG. 8 is a cross-sectional diagram of the substrate 100, the mold 200 and the ink droplets 310 arranged on the substrate 100. As shown in (a) of FIG. 8, the ink droplets 310 are arranged so as to avoid the positions corresponding to the grooves 210.

(b) of FIG. 8 is a cross-sectional diagram of a state where the mold 200 has been made to contact the ink droplets 310 on the substrate 100. As shown in (b) of FIG. 8, when the mold 200 contacts (imprints) against the ink droplet 310 on the substrate 100 with a suitable pressure, a liquid bridge is formed by the ink droplets 310 (functional film 312) which are filled in between the mold 200 and the substrate 100.

The ink droplets 310 (functional film 312) which have wet and spread are pinned by the grooves 210 formed in the mold 200, and hence the ink droplets 310 (functional film 312) of different regions, which are demarcated by the grooves 210, never mix together.

In this way, the grooves 210 are formed with the object of preventing intermixing of the ink droplets 310 (functional films 312) which have been arranged in the respective regions. Rather than forming grooves 210, it is also possible to increase the interval between the regions to the extent that the ink droplets 310 (functional films 312) do not mix together, and it is also possible to form regions by a lyophilic and repelling pattern. Similar beneficial effects can also be obtained when these methods are used.

Next, ultraviolet light is irradiated from the rear surface side of the substrate 100, thereby curing the functional films 312 (step S8: curing step). After curing the functional films 312, the mold 200 is separated from the cured functional films 312 (step S9: separating step).

(c) of FIG. 8 is a cross-sectional diagram showing a functional film 312 and a substrate 100 after separating the mold 200. In this way, functional films 312 having a prescribed thickness are formed from the ink droplets 310 that have been ejected onto the respective regions.

Next, the thicknesses of the functional films 312 formed respectively in the four regions 102, 104, 106 and 108 are measured (step S10: measuring step). The film thickness measurement is carried out using an atomic force microscope (AFM). By using the AFM, it is possible to observe the film at the atomic level, and highly accurate measurement is possible. Furthermore, it is also possible to use an ellipsometer. Using an ellipsometer allows the film thickness to be measured relatively easily and accurately.

The film thickness is measured at a plurality of positions in each region and the average of these measurement values is taken to be the film thickness of the corresponding region.

Next, a table showing the correspondences between the drive voltage of the ejection waveform, the ejection velocity, and the film thickness is created (step S11).

Figure 9:
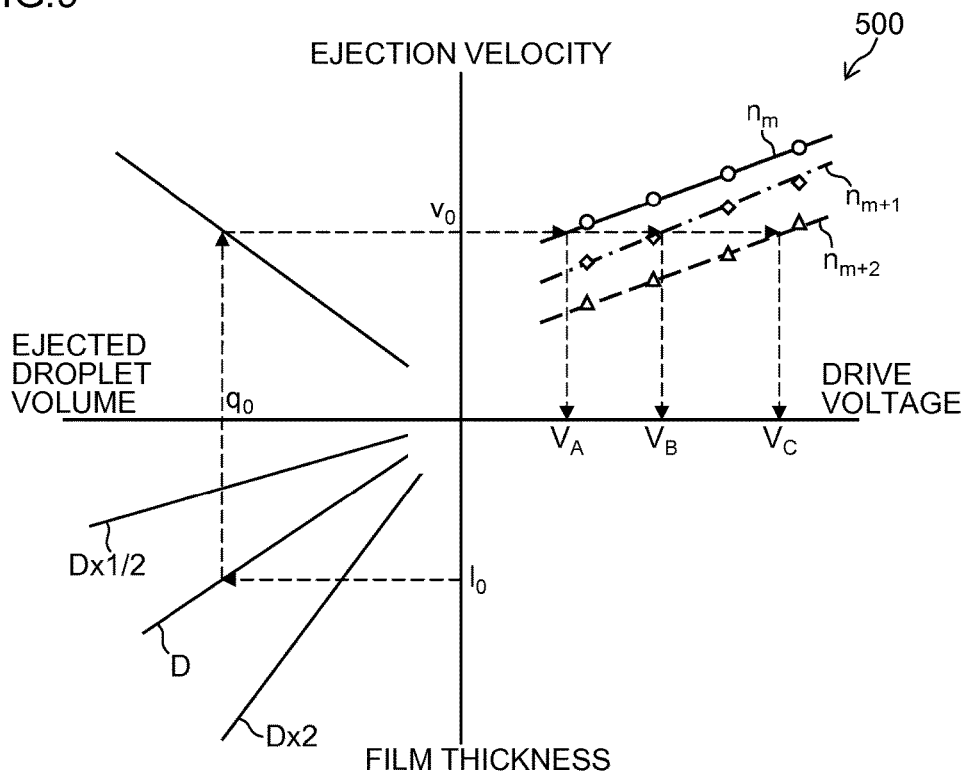
FIG. 9 is a diagram showing a table created.

FIG. 9 is a diagram showing one example of a table 500 which is created in step S11. The first quadrant of the table 500 shows a relationship between the drive voltage of the ejection waveform and the ejection velocity of the droplets.

From the measurement results in step S4, it is possible to plot the drive voltage of the four ejection waveforms 402, 404, 406 and 408, and the ejection velocities relating to each of the respective ejection waveforms, for each of the nozzles. FIG. 9 shows an example in which results are plotted for nozzle nm, nozzle $n_{m+1}$ and nozzle $n_{m+2}$.

For the data other than the measurement points, a table is created by interpolating or extrapolating from the data of the measurement points.

Moreover, the third quadrant of the table 500 indicates a relationship between the ejected droplet volume and the film thickness of the generated functional film.

As described above, droplet ejection is performed onto the region 102 of the substrate 100 at the drive voltage $V_1$, onto the region 104 at the drive voltage $V_2$, onto the region 106 at the drive voltage $V_3$ and onto the region 108 at the drive voltage $V_4$. Furthermore, in step S10, the thickness of the functional film of the respective regions 102, 104, 106 and 108 is measured. Consequently, the relationship between the drive voltage of the ejection waveform and the film thickness is determined.

Furthermore, it is possible to calculate the ejected droplet volume in each region from the surface area of the regions 102, 104, 106 and 108, the film thickness of the functional film in each region, and the droplet ejection density D set in step S1. Consequently, the relationship between the drive voltage of the ejection waveform and the ejected droplet volume is determined.

From these two relationships, it is possible to plot the relationship between the film thickness and the ejected droplet volume. Since the droplet ejection density and the film thickness have a proportional relationship, then it is possible to plot the relationship corresponding to the droplet ejection density. The example in FIG. 9 also plots, apart from the droplet ejection density D, a straight line corresponding to a droplet ejection density of 2D and a relationship when the droplet ejection density is 0.5D.

Furthermore, the second quadrant in table 500 shows the relationship between the ejected droplet volume and the ejection velocity.

In the first quadrant, it is possible to plot the relationship between the ejection droplet volume and the ejection velocity from the relationship between the drive voltage of the ejection waveform and the ejection velocity which was plotted in the first quadrant, and the relationship between the drive voltage of the ejection waveform and the ejected droplet volume which was described above.

In this way, a table 500 showing the correspondences between the drive voltage of the ejection waveform, the ejection velocity, and the film thickness is created.

Next, the drive voltage of the ejection waveform is calculated using this table 500 (step S12). Here, the film thickness required for actual nano-imprinting is I0 and the droplet ejection density is D.

From the third quadrant of table 500, the ejected droplet volume when the required film thickness is I0 and the droplet ejection density is D is found to be q0. Moreover, from the second quadrant of the table 500, the ejection velocity relating to an ejected droplet volume of q0 is found to be v0.

The drive voltage of each nozzle corresponding to an ejection speed of v0 is found from the first quadrant of the table 500. In the example in FIG. 9, the drive voltages of the nozzles $n_m$, $n_{m+1}$ and $n_{m+2}$ are respectively $V_A$, $V_B$ and $V_C$.

Finally, the drive voltages of each nozzle are set to the drive voltages which were calculated at step S12 (step S13: correcting step). There are four types of drive voltage of the ejection waveform for film thickness measurement, namely $V_1$ to $V_4$, as shown in FIG. 5, but the drive voltages of the ejection waveform during actual nano-imprinting can be set to any desired value.

Rather than correcting the drive voltages of the nozzles, it is also possible to adopt a mode which corrects the droplet ejection density.

By driving the nozzles with an ejection waveform of the drive voltage which is set in this way, and performing the nano-imprinting which is shown in (a) to (f) of FIG. 1, it is possible to achieve uniform residual film thickness between the substrates.

The droplet ejection arrangement pattern for film thickness measurement which is set on the substrate 100 in step S1 is arranged in such a manner that ink droplets ejected from all of the nozzles of the inkjet head 300 are contained within one region. Consequently, it is possible to measure the average film thickness including variations between nozzles.

The table 500 shown in FIG. 9 is newly created when the production batch of the resist material is changed. Furthermore, this table is newly created also when the inkjet head is replaced. By this means, it is possible to achieve uniform film thickness between the substrates, regardless of the batch of resist material and the inkjet head.

Second Embodiment

In the first embodiment, droplets are ejected from all of the nozzles onto one region, but in the present embodiment, droplets are ejected onto different regions for each nozzle.

Figure 10:
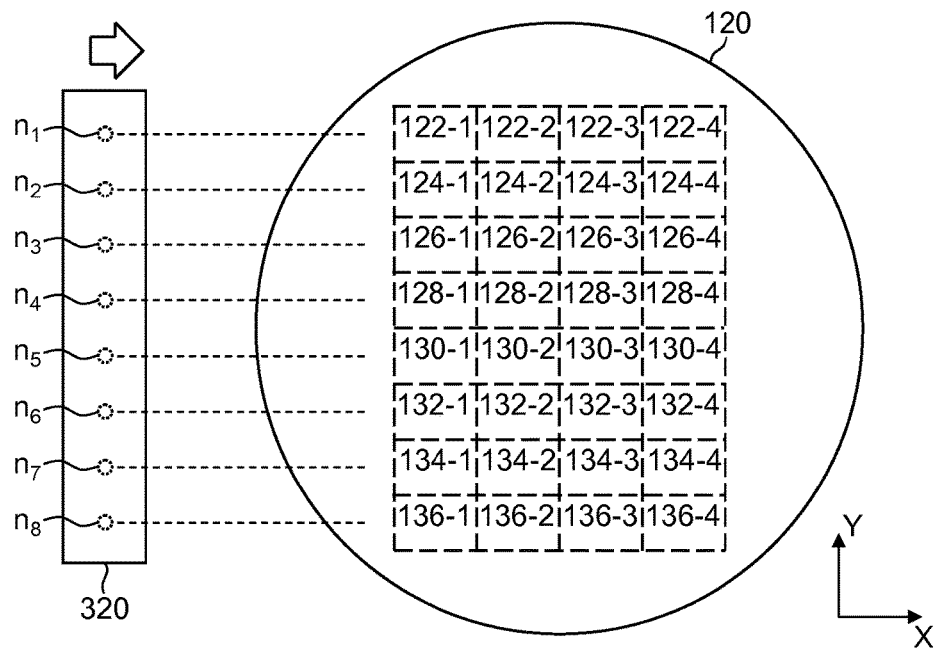
FIG. 10 is a schematic drawing showing a substrate for film thickness measurement and an inkjet head relating to a second embodiment.

FIG. 10 is a schematic drawing showing a substrate for film thickness measurement (substrate 120) relating to the present embodiment, and an inkjet head 320 which arranges functional ink droplets on the substrate 120 by ejecting functional inks while moving by means of a scanning device (not illustrated).

32 regions 122-1, 122-2, 122-3, 122-4, 124-1, . . . , 136-3 and 136-4 are set on the front surface of the substrate 120 so as to correspond to the regions of the mold described below.

The inkjet head 320 is composed so as to be capable of performing a scanning action in X and Y directions over the front surface of the substrate 120 by means of a scanning device (not illustrated). 8 nozzles n1 to n8 which eject functional ink are arranged in one direction in the lower surface of the inkjet head 320.

When the inkjet head 320 is scanned in the X direction, the nozzle n1 ejects droplets of ink onto the regions 122-1, 122-2, 122-3 and 122-4. Similarly, the nozzle n2 ejects droplets of ink onto the regions 124-1 to 124-4, the nozzle n3 ejects droplets of ink onto the regions 126-1 to 126-4, and the nozzle n8 ejects droplets of ink onto the regions 136-1 to 136-4.

Furthermore, the nozzles n1 to n8 are set to ejection conditions whereby ink droplets are ejected using the ejection waveform 402 shown in FIG. 5 in the regions 122-1, 124-1, 126-1, . . . and 136-1. Similarly, ejection conditions are set in such a manner that ink droplets are ejected using the ejection waveform 404 in the regions 122-2, 124-2, 126-2, . . . and 136-2, ink droplets are ejected using the ejection waveform 406 in the regions 122-3, 124-3, 126-3, . . . and 136-3, and ink droplets are ejected using the ejection waveform 408 in the regions 122-4, 124-4, 126-4, . . . and 136-4.

Consequently, for example, the nozzle n1 ejects ink by the ejection waveform 402 in region 122-1, by the ejection waveform 404 in region 122-2, by the ejection waveform 406 in region 122-3 and by the ejection waveform 408 in region 122-4. Furthermore, the nozzle n2 ejects ink by the ejection waveform 402 in region 124-1, by the ejection waveform 404 in region 124-2, by the ejection waveform 406 in region 124-3 and by the ejection waveform 408 in region 124-4.

In this way, ink is ejected by altering the nozzle and the drive voltage of the ejection waveform, in a matrix fashion, in each region. Similarly to the first embodiment, the relationship between the drive voltage of the ejection waveform of each nozzle and the ejection velocity is measured in advance.

Figure 11:
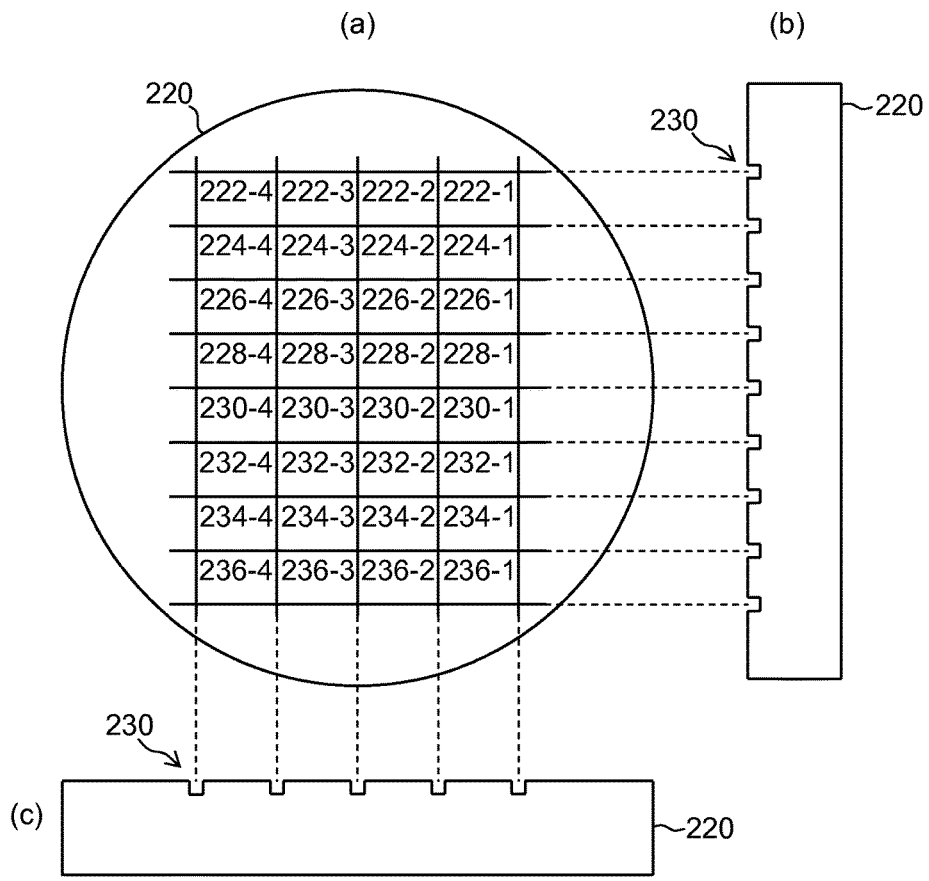
FIG. 11 is a diagram showing an imprinting surface of a mold relating to the second embodiment.

(a) of FIG. 11 is a diagram showing a contacting surface of a mold 220 relating to the present embodiment, (b) of FIG. 11 is a diagram showing a cross-section of the mold 220 in the Y direction, and (c) of FIG. 11 is a diagram showing a cross-section of the mold 220 in the X direction. Grooves 230 are formed in the contacting surface of the mold 220, and 32 regions 222-1, 222-2, 222-3, 222-4, 224-1, 224-2, . . . , 236-3 and 236-4 which are surrounded by the grooves 230 are created.

The regions 122-1 to 136-4 of the substrate 120 described above are set so as to correspond to the regions 222-1 to 236-4 of the mold 220. In other words, the regions 122-1 to 136-4 of the substrate 120 and the regions 222-1 to 236-4 of the mold 220 are set so as to be respectively overlapping when the contacting surface of the mold 220 is set to oppose the front surface of the substrate 120.

The contacting surface of the mold 220 is made to contact the functional ink droplets which have been arranged on the front surface of the substrate 120, with a prescribed pressing force. Moreover, the functional ink (functional film) is cured by irradiating ultraviolet light from the rear surface of the substrate 120, and the mold 220 is separated from the cured functional film.

Figure 12:
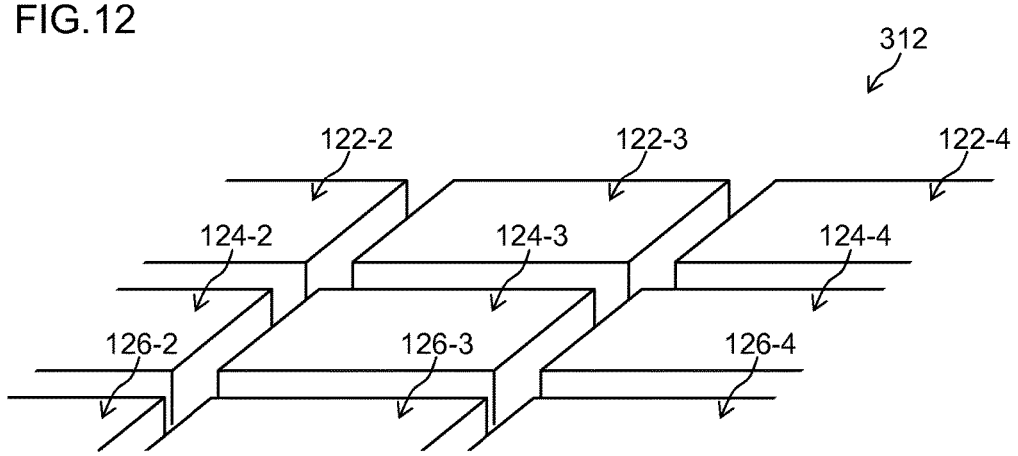
FIG. 12 is a diagram of resist formed on a front surface side of a substrate.

FIG. 12 is a diagram showing one portion of a functional film 312 which has been formed on a front surface of the substrate 120 in this way. As shown in FIG. 12, the functional film 312 is generated by dividing into respective regions which are set respectively on the substrate 120, by the grooves 230 formed on the mold 220.

By measuring the film thickness of the functional film 312 in the respective regions, a table is created for each nozzle indicating the correspondences between the drive voltage of the ejection waveform, the ejection velocity and the film thickness. In other words, in the table 500 shown in FIG. 9, it is possible to determine, for each nozzle, a relationship between the ejected droplet volume and the thickness of the functional film in the third quadrant, and the relationship between the ejected droplet volume and the ejection velocity in the second quadrant.

In this way, according to the present embodiment, since a table can be created for each nozzle, then it is possible to correct the ink ejection volume for each nozzle and a uniform residual film thickness can be achieved between the substrates.

Third Embodiment

In the present embodiment, when actually carrying out nano-imprinting, the ejection volume is corrected by measuring the ejection velocity. Here, the table 500 in the first embodiment is created in advance and is stored on the storage device, such as a memory.

Figure 13:
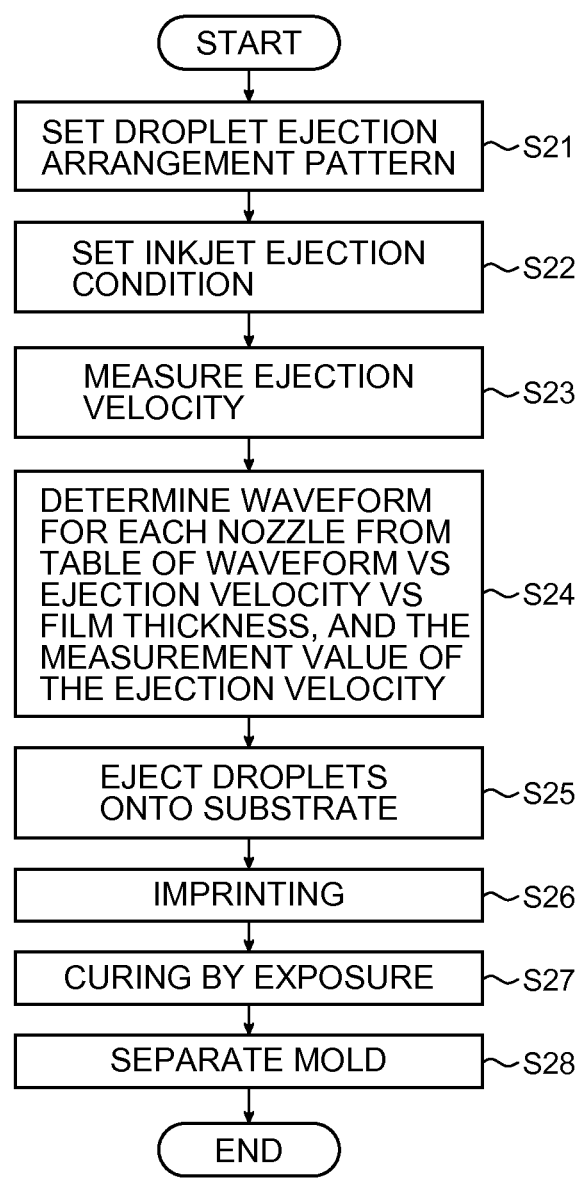
FIG. 13 is a flowchart showing an inkjet ejection volume correction method relating to a third embodiment.

FIG. 13 is a flowchart showing a method of correcting an inkjet ejection volume relating to the present embodiment.

Firstly, a droplet ejection arrangement pattern is set based on pattern information for the mold used (step S21). The mold used here is a mold for actually carrying out nano-imprinting, rather than a mold for film thickness measurement.

Next, the inkjet ejection conditions are set (step S22). Here, the ejection conditions should be set provisionally.

Subsequently, ink droplets are ejected by the respective ejection waveforms (drive voltages), from each nozzle, and the ejection velocity is measured (step S23).

Thereupon, the ejected droplet volume corresponding to the desired film thickness (for example, $I_0$) is determined ($q_0$) from the table 500 stored in the memory, and the ejection velocity ($v_0$) corresponding to this ejected droplet volume is determined. From the relationship between the drive voltage and the ejection velocity measured in step S23, the drive voltage corresponding to this ejection velocity ($v_0$) is calculated (step S24).

Ink is ejected onto the substrate by using an ejection waveform of the drive voltage specified in this way (step S25). Thereupon, the mold is imprinted onto the substrate on which the ink has been arranged (step S26), the ink is exposed and cured (step S27) and the mold is separated (step S28).

By storing a table in advance in this way, it is possible to correct the ejection volume of each nozzle in such a manner that a suitable film thickness can be formed, simply by measuring the ejection velocity in advance, and hence a uniform residual film thickness between substrates can be achieved.

Even with the same nozzle, the correspondence between the drive voltage and the ejection velocity changes over time, due to deterioration of the piezo element, and the like. However, it is complicated to create the table 500 according to the first and second embodiments on each occasion. Consequently, ejection volume correction processing according to the present embodiment should be carried out when operation is started or the power supply to the apparatus is switched on, etc. According to the present embodiment, even in a case where the correspondence between the drive voltage and the ejection velocity changes after the table has been created, it is possible to correct the ejection volume appropriately simply by measuring the ejection velocity.

(Overview of Nano-Imprinting System)

Figure 14:
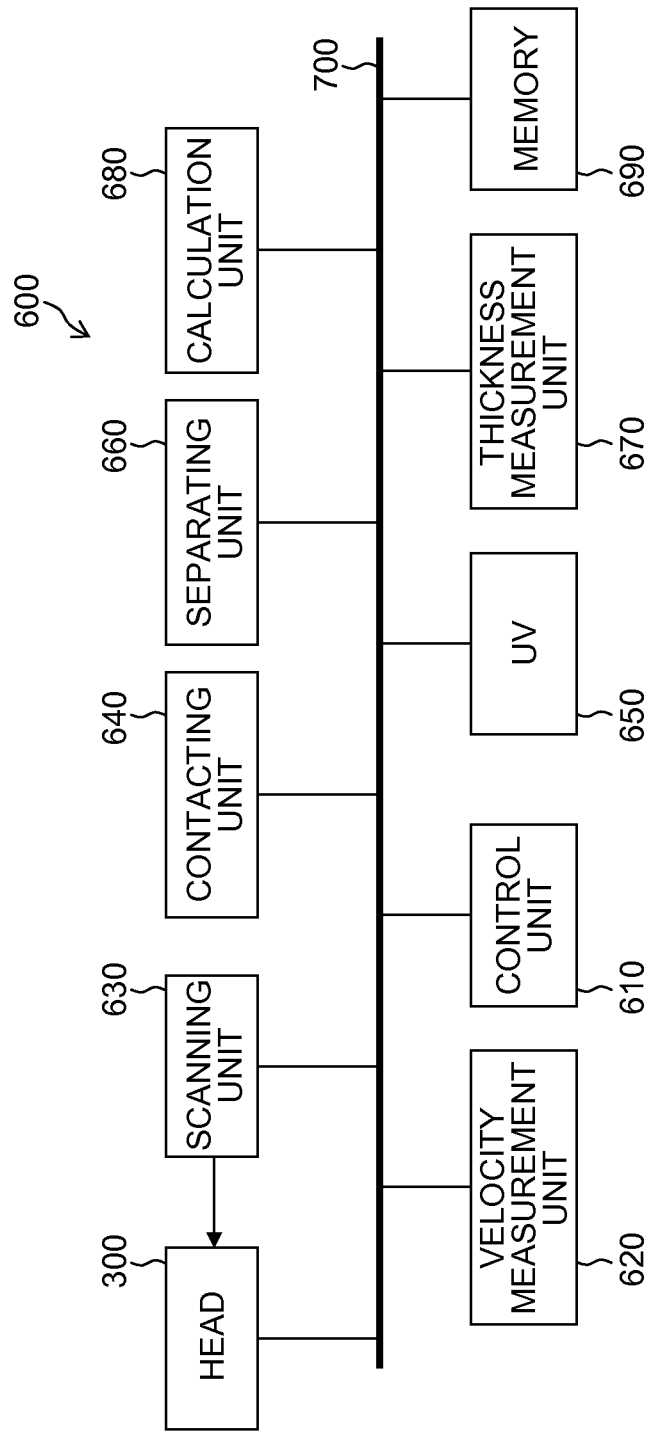
FIG. 14 is a block diagram showing a composition of a functional ink arrangement apparatus.

FIG. 14 is a block diagram showing a composition of a nano-imprinting system 600 which is employed in the first to third embodiments. As shown in FIG. 14, the nano-imprinting system 600 is constituted by an inkjet head 300, a control unit 610, a velocity measurement unit 620, a scanning unit 630, a contacting unit 640, an ultraviolet light irradiation unit 650, a separating unit 660, a thickness measurement unit 670, a calculation unit 680, a memory 690 and a control bus 700.

The nano-imprinting system 600 is controlled overall by the control unit 610. Control signals are transmitted from the control unit 610 to the respective parts of the system by the control bus 700.

In the inkjet head 300, a plurality of nozzles which eject functional ink are arranged in the lower surface at a prescribed interval in a prescribed direction.

The velocity measurement unit 620 measures the ejection velocity of the ink droplets ejected from the nozzles of the inkjet head 300, by strobe observation, for example.

The scanning unit 630 causes relative movement of the inkjet head 300 and the substrate (not illustrated in FIG. 14), by moving the inkjet head 300 in the horizontal direction.

The control unit 610 arranges ink droplets discretely on the substrate by moving the inkjet head 300 over the substrate by the scanning unit 630, while ejecting droplets of functional ink from the nozzles of the inkjet head 300. In this case, the drive voltage of the nozzles is controlled in such a manner that the ejection volumes are different in each region which is set on the substrate.

The contacting unit 640 causes the mold (not illustrated in FIG. 14) to make contact with the ink droplets arranged on the front surface of the substrate with a prescribed pressing force.

The ultraviolet light irradiation unit 650 irradiates ultraviolet light from the rear surface side of the substrate so as to cure the ink droplets arranged on the front surface of the substrate and generate a functional film. If the mold has transmissive properties, ultraviolet light may be irradiated from the front surface side of the substrate.

The separating unit 660 separates the mold from the cured functional film. The separation method is not limited in particular, and a common method, such as a pressurized separation method, can be used.

The thickness measurement unit 670 is an ellipsometer, for example, and measures the thickness of the functional film (film thickness).

The calculation unit 680 creates a table indicating a correspondence between the drive voltage, the ejection velocity and the film thickness, based on the drive voltage of the nozzles in each region, the ejection velocity measured by the velocity measurement unit 620, and the thickness of the functional film measured by the thickness measurement unit 670.

The memory 690 is a non-volatile memory, such as a flash memory. The control unit 610 stores the table created by the calculation unit 680 in the memory 690.

According to the nano-imprinting system 600 composed in this way, it is possible to create and store a table indicating the correspondence between the drive voltage the ejection velocity and the film thickness. Here, by providing a built-in memory 690 in the inkjet head 300, then even if the inkjet head 300 is installed in a different functional ink arrangement apparatus (not illustrated), it is possible to carry out an ejection volume correction process using the table stored in the memory 690, in that functional ink arrangement apparatus. As a result of this, it is possible to achieve uniform residual film thickness between substrates, in the functional ink arrangement apparatus.

The technical scope of the present invention is not limited to the range stated in the embodiments described above. The compositions, and the like, in the respective embodiments can be combined suitably between the respective embodiments within a range that does not depart from the essence of the present invention.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An ejection volume correction method for an inkjet head, comprising:
    an arranging step of ejecting a volume of functional ink as ink droplets from nozzles of an inkjet head so as to discretely arrange the ink droplets on a front surface of a substrate;
    a contacting step of filling the functional ink in between a mold and the substrate by causing the mold to contact the ink droplets arranged on the front surface of the substrate;
    a curing step of curing the filled functional ink so as to generate a functional film;
    a separating step of separating the mold from the functional film;
    a measuring step of measuring a thickness of the functional film; and
    a correcting step of correcting an ejection volume from the nozzles based on the measured thickness such that the volume of functional ink ejected from the inkjet head remains uniform between the substrate and another substrate to thereby maintain a uniform thickness between the functional film on the substrate and another functional film on the another substrate, wherein:
    a surface of the mold configured to contact with the ink droplets has a plurality of flat regions surrounded by grooves;
    in the arranging step, the ink droplets are arranged by changing the ejection volume from the nozzles respectively in a plurality of regions on the front surface of the substrate that correspond respectively to the flat regions on the surface of the mold while avoiding arranging the ink droplets at positions on the front surface of the substrate that correspond to the grooves on the surface of the mold such that the grooves demarcate the ink droplets arranged in positions corresponding to one of the flat regions from the ink droplets arranged in positions corresponding to another of the flat regions; and
    in the measuring step, the thickness of the functional film is measured in each of the regions on the front surface of the substrate.

2. The ejection volume correction method for an inkjet head as defined in claim 1,
    wherein the ejection volume from the nozzles is changed by changing a drive voltage of the nozzles in the arranging step, and
    the drive voltage of the nozzles is corrected in the correcting step.

3. The ejection volume correction method for an inkjet head as defined in claim 1, wherein, in the arranging step, ink droplets ejected from all of the nozzles are arranged in each of the regions on the front surface of the substrate.

4. The ejection volume correction method for an inkjet head as defined in claim 1,
    wherein, in the arranging step, ink droplets ejected from different nozzles are arranged respectively in the regions on the front surface of the substrate, and
    in the correcting step, the ejection volume is corrected for each of the nozzles based on the measured thickness.

5. The ejection volume correction method for an inkjet head as defined in claim 1,
    wherein a plurality of nozzles are arranged in the inkjet head at a prescribed interval in a prescribed direction, and
    the ink droplets are arranged at a shorter interval than the prescribed interval in the arranging step.

6. The ejection volume correction method for an inkjet head as defined in claim 1, wherein, in the arranging step, the ink droplets are arranged in such a manner that an interval between the ink droplets is greater than a diameter of the ink droplets.

7. The ejection volume correction method for an inkjet head as defined in claim 1, further comprising:
    a velocity measuring step of measuring an ejection velocity of the ink droplets ejected from the nozzles; and a storing step of storing a relationship between the measured ejection velocity and the measured thickness in a memory, wherein, in the correcting step, the ejection volume from the nozzles is corrected based on the measured ejection velocity.

8. The ejection volume correction method for an inkjet head as defined in claim 1, wherein the thickness of the functional film is measured with an atomic force microscope in the measuring step.

9. The ejection volume correction method for an inkjet head as defined in claim 1, wherein the thickness of the functional film is measure with an ellipsometer in the measuring step.

* * * * *